United States Patent
Matick et al.

(10) Patent No.: US 7,499,312 B2
(45) Date of Patent: Mar. 3, 2009

(54) FAST, STABLE, SRAM CELL USING SEVEN DEVICES AND HIERARCHICAL BIT/SENSE LINE

(75) Inventors: Richard E. Matick, Cortlandt Manor, NY (US); Stanley E. Schuster, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 11/620,316

(22) Filed: Jan. 5, 2007

(65) Prior Publication Data

US 2008/0165562 A1 Jul. 10, 2008

(51) Int. Cl.
*G11C 11/00* (2006.01)
*G11C 5/06* (2006.01)

(52) U.S. Cl. .................................. 365/154; 365/63
(58) Field of Classification Search ................ 365/154, 365/155, 156, 63
See application file for complete search history.

(56) References Cited

U.S. PATENT DOCUMENTS

| | | | |
|---|---|---|---|
| 4,633,443 A | 12/1986 | Childers | |
| 5,675,529 A | 10/1997 | Poole | |
| 5,917,744 A | 6/1999 | Kirihata et al. | |
| 5,917,745 A | 6/1999 | Fujii | |
| 5,973,983 A | 10/1999 | Hidaka | |
| 6,130,845 A | 10/2000 | Ootsuki et al. | |
| 6,278,630 B1 | 8/2001 | Yamada | |
| 6,288,969 B1 | 9/2001 | Gibbins et al. | |
| RE37,409 E | 10/2001 | Barth et al. | |
| 6,333,866 B1 | 12/2001 | Ogata | |
| 6,426,905 B1 | 7/2002 | Dennard et al. | |
| 6,442,060 B1 | 8/2002 | Leung et al. | |
| 6,448,818 B1 | 9/2002 | Fletcher | |
| 6,449,201 B1 | 9/2002 | Kojima | |
| 6,456,521 B1 | 9/2002 | Hsu et al. | |
| 6,542,424 B2 | 4/2003 | Endo et al. | |
| 6,650,572 B2 | 11/2003 | Issa | |
| 6,657,886 B1 | 12/2003 | Adams et al. | |
| 6,738,306 B2 * | 5/2004 | McLaury | 365/230.05 |
| 6,898,663 B2 | 5/2005 | Winograd et al. | |
| 6,901,017 B2 | 5/2005 | Shimizu | |
| 7,057,230 B2 | 6/2006 | Tanaka et al. | |
| 7,082,076 B2 | 7/2006 | Terzioglu et al. | |
| 7,088,638 B1 | 8/2006 | Bunce et al. | |
| 7,321,504 B2 * | 1/2008 | Boemler | 365/154 |
| 2004/0156228 A1 * | 8/2004 | Becker | 365/154 |

(Continued)

FOREIGN PATENT DOCUMENTS

EP 1498903 A2 1/2005

(Continued)

*Primary Examiner*—Ly D Pham
(74) *Attorney, Agent, or Firm*—Cantor Colburn LLP; Mark Wardas

(57) ABSTRACT

An embodiment of the present invention is an SRAM memory array comprising memory cells with each cell containing seven devices, wherein the basic storage nodes, which store the true and complement of the data, are constructed from six devices, forming a cross-coupled flip-flop cell. One internal storage node of this cell being connected to a separate read-pass device which passes the state of this node to a local bit line (LBL) for single-ended sensing, with the gate of this separate read-pass device connected to a separate read-word line.

4 Claims, 11 Drawing Sheets

U.S. PATENT DOCUMENTS

| | | |
|---|---|---|
| 2005/0018510 A1 | 1/2005 | Terzioglu et al. |
| 2005/0125591 A1 | 6/2005 | Fujimoto |
| 2005/0141258 A1 | 6/2005 | Kang et al. |
| 2006/0023553 A1 | 2/2006 | Takeyama et al. |
| 2006/0067144 A1 | 3/2006 | Liu |
| 2006/0227595 A1* | 10/2006 | Chuang et al. ............ 365/154 |
| 2007/0159873 A1* | 7/2007 | Boemler .................... 365/154 |
| 2007/0242498 A1* | 10/2007 | Chandrakasan et al. ..... 365/154 |

FOREIGN PATENT DOCUMENTS

JP  2004153700  5/2004

* cited by examiner

| Run# | N0 W/L (u) | P0 W/L (u) | N1 W/L (u) | P1 W/L (u) | Read-Pass W/L (u) | Read Head W/L (u) | # bits on LRBL | # LBL on GRBL | Total #bits On GRBL = #WL per column | T delay [WLr to GRBL [50%] psec |
|---|---|---|---|---|---|---|---|---|---|---|
| 27 | .09/.07 | .09/.07 | .09/.07 | .09/.07 | .06/.065 | .25/.065 | 8 (.5 fF) | 8 (5 fF) | 64 | 68 |
| 26 | .09/.07 dVt= -75mV | .09/.07 dVt = +75mV | .09/.07 dVt= +75mV | .09/.07 dVt= -75mV | .06/.065 | .25/.065 dVt=0 | 8 (.5 fF) | 8 (5 fF) | 64 | 71 |
| 2 | .09/.07 | .09/.07 | .09/.07 | .09/.07 | .06/.065 | .25/.065 | 8 (.5 fF) | 16 (10 fF) | 128 | 96 |
| 21 | .09/.07 dVt=0 | .09/.07 dVt=0 | .09/.07 dVt=0 | .09/.07 dVt=0 | .06/.065 | .25/.065 dVt=0 | 16 (1 fF) | 16 (20 fF) | 256 | 168 |

Fig. 6

| Run# | N0 W/L (u) | P0 W/L (u) | N1 W/L (u) | P1 W/L (u) | Pull-Down W/L (u) | Read-Select W/L (u) | Total #bits On RBL = # WL per column (C load) | T delay [WLr to GRBL [50%] psec |
|---|---|---|---|---|---|---|---|---|
| 1 | .09/.07 | .09/.07 | .09/.07 | .09/.07 | .25/.06 | .09/.065 | 64 (5 fF) | 122 |
| 4 | .09/.07 | .09/.07 | .09/.07 | .09/.07 | .25/.06 | .13/.065 | 64 (5 fF) | 98 |
| 6 | .09/.07 | .09/.07 | .09/.07 | .09/.07 | .25/.06 | .09/.065 | 128 (10 fF) | 234 |
| 5 | .09/.07 | .09/.07 | .09/.07 | .09/.07 | .25/.06 | .13/.065 | 128 (10 fF) | 188 |
| 2 | .09/.07 | .09/.07 | .09/.07 | .09/.07 | .25/.06 | .09/.065 | 256 (20 fF) | 444 |
| 3 | .09/.07 | .09/.07 | .09/.07 | .09/.07 | .25/.06 | .13/.065 | 256 (20 fF) | 357 |

| Run# | N0 W/L (u) | P0 W/L (u) | N1 W/L (u) | P1 W/L (u) | Read-Pass W/L (u) | Read Head W/L (u) | # bits on LRBL (C load) | # LBL on GRBL (C load) | Total #bits On GRBL = # WL per column | T delay [WLr to GRBL [50%] psec |
|---|---|---|---|---|---|---|---|---|---|---|
| 5 | .09/.07 dVt= -25mV | .09/.07 dVt= +25mV | .09/.07 dVt= +25mV | .09/.07 dVt= -25mV | .06/.065 | .25/.065 dVt=+.2 V | 8 (.5 fF) | 16 (10 fF) | 128 | 153 |
| 6 | .09/.07 dVt= -50mV | .09/.07 dVt= +50mV | .09/.07 dVt= +50mV | .09/.07 dVt= -50mV | .06/.065 | .25/.065 dVt=+.2 V | 8 (.5 fF) | 16 (10 fF) | 128 | 155 Very stable |
| 7 | .09/.07 dVt= -75mV | .09/.07 dVt= +75mV | .09/.07 dVt= +75mV | .09/.07 dVt= -75mV | .06/.065 | .25/.065 dVt=+.2 V | 8 (.5 fF) | 16 (10 fF) | 128 | 157 Very stable |
| 10 | .09/.07 dVt= -.1V | .09/.07 dVt= +.1V | .09/.07 dVt= +.1V | .09/.07 dVt= -.1V | .06/.065 | .25/.065 dVt=+.2 V | 8 (.5 fF) | 16 (10 fF) | 128 | 163 |
| 11 | .09/.07 dVt= -.1V | .09/.07 dVt= +.1V | .09/.07 dVt= +.1V | .09/.07 dVt= -.1V | .06/.065 | .25/.065 dVt=0 | 8 (.5 fF) | 16 (10 fF) | 128 | 101 |
| 15 | .09/.07 dVt=0 | .09/.07 dVt=0 | .09/.07 dVt=0 | .09/.07 dVt=0 | .06/.065 | .25/.065 dVt=0 | 8 (.5 fF) | 16 (10 fF) | 128 | 95 |

| Run# | N0 W/L (u) | P0 W/L (u) | N1 W/L (u) | P1 W/L (u) | Read-Pass W/L (u) | Read Head W/L (u) | # bits on LRBL (C load) | # LBL on GRBL (C load) | Total #bits On GRBL = # WL per column | T delay [WLr to GRBL [50%] psec |
|---|---|---|---|---|---|---|---|---|---|---|
| 21 | .09/.07 dVt=0 | .09/.07 dVt=0 | .09/.07 dVt=0 | .09/.07 dVt=0 | .06/.065 | .25/.065 dVt=0 | 16 (1 fF) | 16 (20 fF) | 256 | 168 |
| 22 | .09/.07 dVt= -25mV | .09/.07 dVt= +25mV | .09/.07 dVt= +25mV | .09/.07 dVt= -25mV | .06/.065 | .25/.065 dVt=0 | 16 (1 fF) | 16 (20 fF) | 256 | 176 |
| 23 {24} | .09/.07 dVt= -50mV | .09/.07 dVt= +50mV {.012/.07} | .09/.07 dVt= +50mV | .09/.07 dVt= -50mV | .06/.065 | .25/.065 dVt=0 | 16 (1 fF) | 16 (20 fF) | 256 | Fails {stable 164} |

Fig. 8B

FAST, STABLE, SRAM CELL USING SEVEN DEVICES AND HIERARCHICAL BIT/SENSE LINE

CROSS-REFERENCE TO RELATED APPLICATIONS

This application contains subject matter, which is related to the subject matter of the following co-pending applications, each of which is assigned to the same assignee as this application, International Business Machines Corporation of Armonk, N.Y. Each of the below listed applications is hereby incorporated herein by reference in its entirety:

Ser. No. 11/620,297 entitled 'Hierarchical Six-Transistor SRAM';

Ser. No. 11/620,282 entitled 'Hierarchical 2T-DRAM with Self-Timed Sensing';

Ser. No. 11/620,328 entitled 'eDRAM Hierarchical Differential Sense AMP'; and

Ser. No. 11/108,369 entitled 'DRAM Hierarchical Data Path'.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to an SRAM memory array comprising memory cells with each cell containing seven devices, and in particular to a memory array wherein the basic storage nodes, which store the true and complement of the data, are constructed from six devices, forming a cross-coupled flip-flop cell. One internal storage node of this cell being connected to a separate read-pass device which passes the state of this node to a local bit line (LBL) for single-ended sensing, with the gate of this separate read-pass device connected to a separate read-word line.

2. Description of Background

Before our invention current six device SRAM cells were encountering significant stability problems as we scale below 0.1 micron. The main reason for this is that the device tolerances, particularly the threshold voltage variations from device to device, do not scale appropriately as the technology scales to smaller dimensions. When an SRAM cell is read, the bit lines are precharged 'HIGH' which places a 'disturb' signal on the '0' node of the cross-coupled flip-flop. For the nominal design case, this 'disturb' signal is quite tolerable. However, if the threshold variations between devices is sufficiently large, this 'disturb' signal can cause some cells to flip state, i.e. a stored '0' becomes a '1' and vice versa. Current SRAM cell designs employ two techniques to circumvent this, 1) reduce threshold variations by making the devices, and hence cell, larger than the smallest size normal scaling rules would allow, and 2) use eight devices per cell, with the extra devices eliminating the 'disturb' signal during reading. Both techniques significantly increase the size of the SRAM cell and hence reduce the density, a very undesirable result.

A typical, 6T SRAM cell has two internal nodes, 'A' and 'B' one example of which is illustrated in prior art FIG. 1A which store '0'/'1' respectively on the two nodes for a stored '0', and the reverse of '1'/'0' respectively on the nodes for a stored '1'. These two nodes are coupled to a pair of balanced bit/sense lines, which are used for both reading and writing. For reading the state of the cell, both bit lines are precharged 'HIGH' through a pass access device on each node (not shown). Subsequently, the word line of the selected row goes 'HIGH' and connects nodes 'A' and 'B' of this cell to the precharged bit lines through devices N2 and N3. As a result, within the cell, the internal storage node, which happens to currently be latched at '0', will thus see a large voltage applied to it, which is the 'disturb' signal. If the difference in threshold voltages of the cross-coupled devices N1 and N2 is sufficiently large, this 'disturb' can cause the voltage on this '0' node to rise sufficiently such that the cross-coupled arrangement will pull the previously '1' node to '0', thus reversing the stored state, a significant error.

One current method used to eliminate this read 'disturb' sensitivity is the use of an eight device SRAM cell one example of which is illustrated in prior art FIG. 1B. This adds two nFET devices, plus one read bit line and one read word line to each cell as illustrated by the encircled area 102. One of the storage nodes, for example node 'B' as illustrated, is connected to the gate of the pull down nFET device. This device has its source grounded and its drain in series with the read-select nFET. This read-select device has its drain tied to a separate read-bit line, while a separate read word line activates its gate. Thus each cell has the addition of two FET devices, plus one read bit line and one read word line.

For a given technology, the threshold variations between adjacent devices become larger as the devices approach minimum dimensions. Thus one method for improving stability is by making the device channel length and width larger, which results in lower density, an undesirable effect. If we wish to increase cell stability without increasing the cell device sizes, the bit line capacitance must be reduced without significantly increasing the effective, average cell size.

SUMMARY OF THE INVENTION

The shortcomings of the prior art are overcome and additional advantages are provided through the provision of an SRAM memory array comprising a plurality of memory cells, each of the plurality of memory cells further comprising a device, each of the plurality of memory cells having seven of the device; a first storage node; a second storage node; and a first local bit line; the first storage node and the second storage node store true and complement of data and are constructed with six of the devices forming a cross-coupled flip-flop cell, one of the devices being configured as a first read-pass device, the second storage node is connected to the first read-pass device, the first read-pass device passes the state of the second storage node to the first local bit line effectuating single ended sensing, the first read-pass device gate is connected to a first read word line.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which is an SRAM memory array comprising memory cells with each cell containing seven devices coupled with a hierarchical bit/sense line structure (7 Transistor/Hierarchical cell, 7T/H) to significantly reduce the read 'disturb' sensitivity associated with a smaller cell size.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 6 illustrates one example of simulation results for 7T/H SRAM of FIG. 2 write-bit line all have 256 cells;

FIG. 7 illustrates one example of simulation results for 8T SRAM of prior art FIG. 1B write-bit line and read-bit line have same number of cells; and FIG. 8A-8B illustrates one example of Vt-Tolerance—stability of 7T/H SRAM of FIG. 2 to device Vt differences. Write-bit lines all have 256 cells.

The detailed description explains the preferred embodiments of the invention, together with advantages and features, by way of example with reference to the drawings.

DETAILED DESCRIPTION OF THE INVENTION

Turning now to the drawings in greater detail, in an exemplary embodiment of the present invention, this invention makes use of a seven device SRAM cell coupled with a hierarchical bit/sense line structure (7 Transistor/Hierarchical cell, 7T/H) to significantly reduce the read 'disturb' sensitivity with a smaller cell size and hence minimal impact on density. It also provides a faster read access for comparable loads on the read bit line. Write time may also be slightly reduced due to the smaller cell size, depending on the technology layout restrictions.

Figure 2:
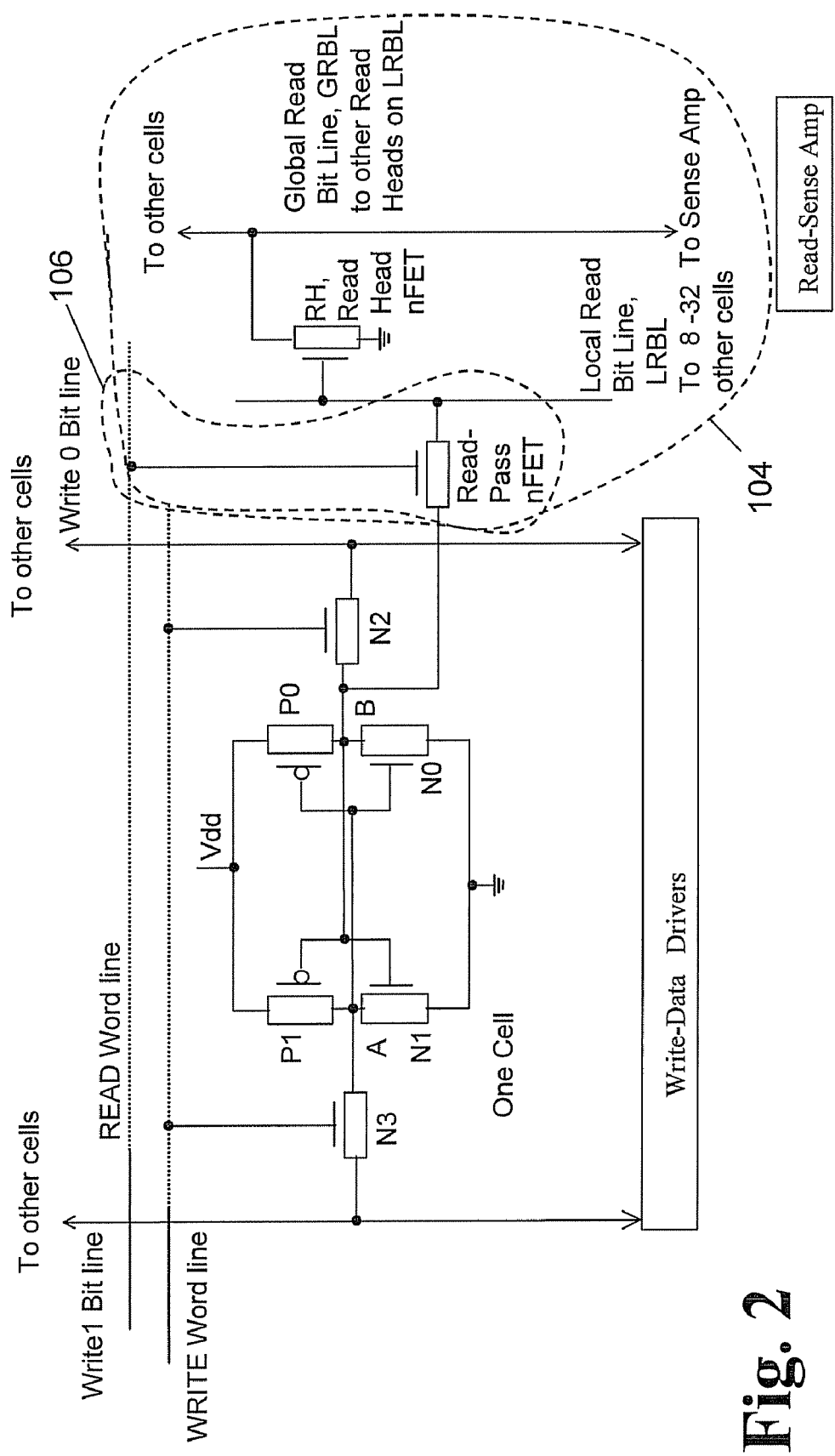
FIG. 2 illustrates one example of a modified SRAM cell showing addition of one read-pass n-device per cell, connected to local read bit line LRBL for isolating the read 'disturb'. Single-ended sensing is used via a hierarchical bit line pair, LRBL and global read bit line GRBL, interconnected by one read-head for every 8 or more (a design parameter) cells per LRBL.

In an exemplary embodiment of the present invention, the 'disturb' signal on the internal node is significantly reduced by the use of only one additional pass gate tied to one of the internal node (either 'A' or 'B') and the pass gate is connected to a local read bit line, LRBL, which is one section of a hierarchical bit line structure one example of which is illustrated in FIG. 2. The circuit 106 encircled is added to each 6T cell. Several cells, such as 8 to 64, depending on the desired speed and other specs, share the local read bit line, LRBL. In the following, 16 bits per LRBL are assumed, to simplify the figures. The local read bit line, LRBL, connected to 16 pass gates from 16 cells, has one read-head device with its source tied to ground, drain tied to a global read bit line, GRBL, and gate connected to the LRBL as illustrated, (for an nFET read-head—a pFET device can also be used for a read-head but is not as effective). Multiple local read bit lines, LRBLs, each with a separate read-head, are connected to a global read bit line as discussed latter.

Figure 3:
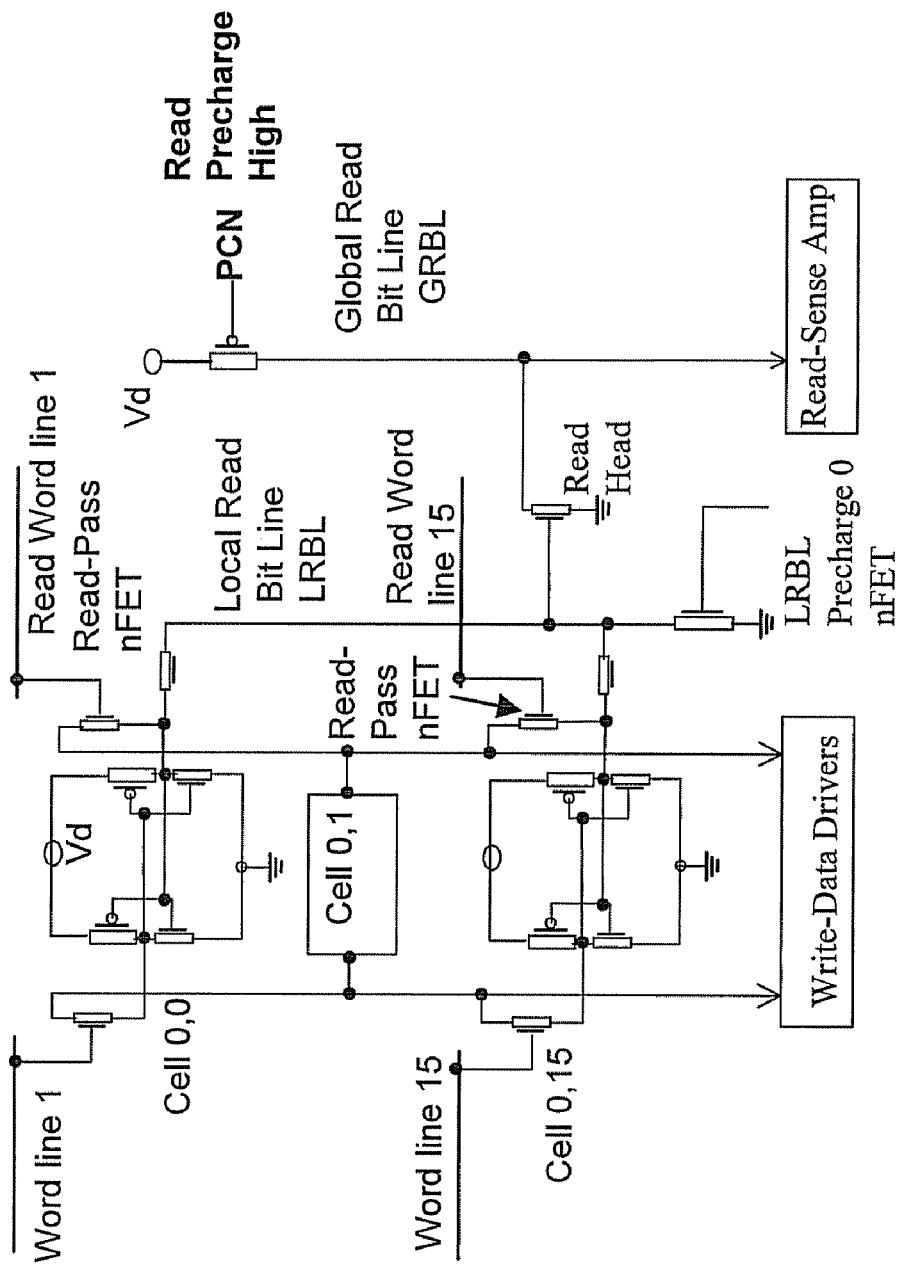
FIG. 3 illustrates one example of a cell showing multiple cells, connected to one complete local read bit line, LRBL for isolating the read 'disturb' issue. Single-ended sensing is used via a hierarchical bit line pair, LRBL and global read bit line GRBL, interconnected by one read-head for every, typically, 8 or more (a design parameter) cells per LRBL. (16 chosen for simplicity)

In addition to the read-head, each LRBL has a separate nFET for discharging and holding LRBL to ground after sensing as indicated by device "LRBL Precharge 0" in FIG. 3. This is required since once an LRBL is charged high, by reading a stored '1' for instance, the read-head will be turned 'ON' and remain 'ON'. If the LRBL is not discharged, subsequent attempts to read other cells which have a stored '0' on the same LRBL will encounter a large voltage already on the LRBL and will possibly give an incorrect sense signal.

Thus one advantage of the present invention is that the SRAM read 'disturb' can be significantly reduced by the addition of only one read-pass nFET per cell plus one read-head and one LRBL Precharge-'0' device per every 8 to 64 cells (depending of design parameters) as illustrated by the encircled circuit 104. The two additional bit lines per cell, namely LRBL and GRBL, run parallel to each other and can be placed on different metal levels to minimize the impact on cell area. This is a substantial area saving and allows a faster read cycle; the amount depending on how much of a density improvement is desired.

Figure 1A:
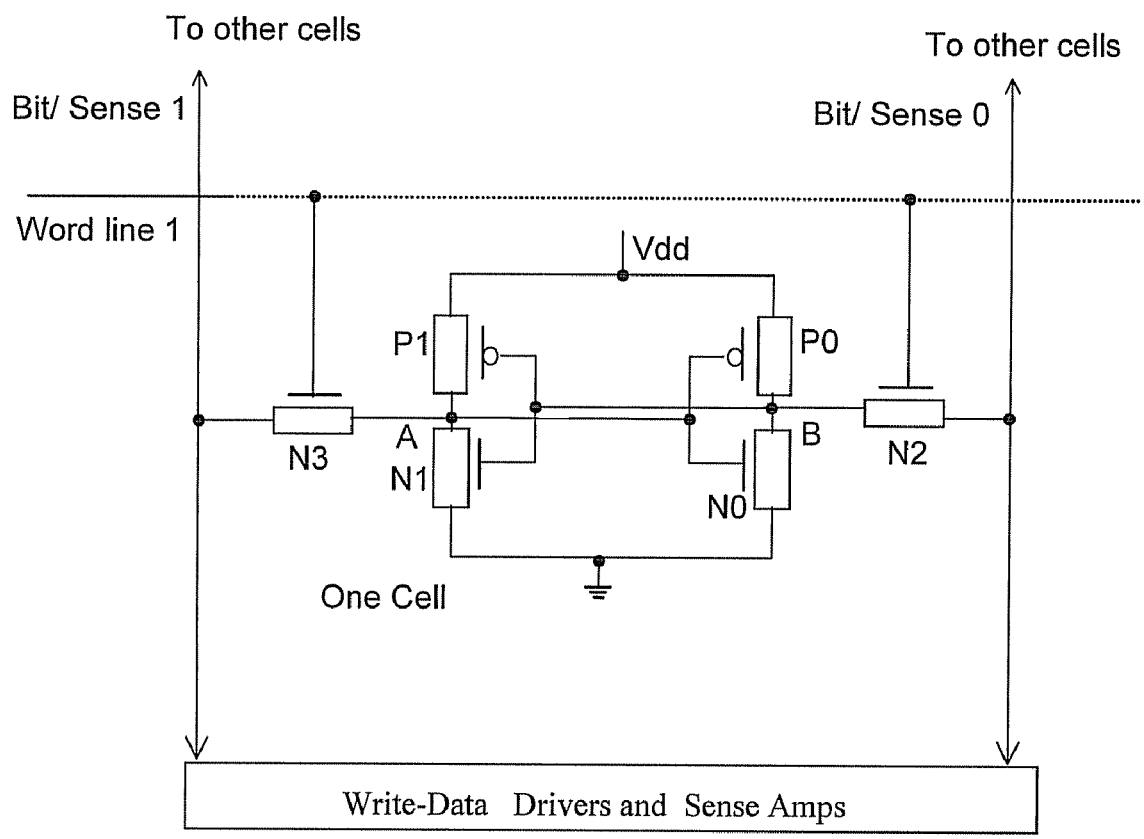
FIG. 1A illustrates one example of a prior art six device (6T) SRAM cell having two internal nodes, 'A' and 'B'.
Figure 1B:
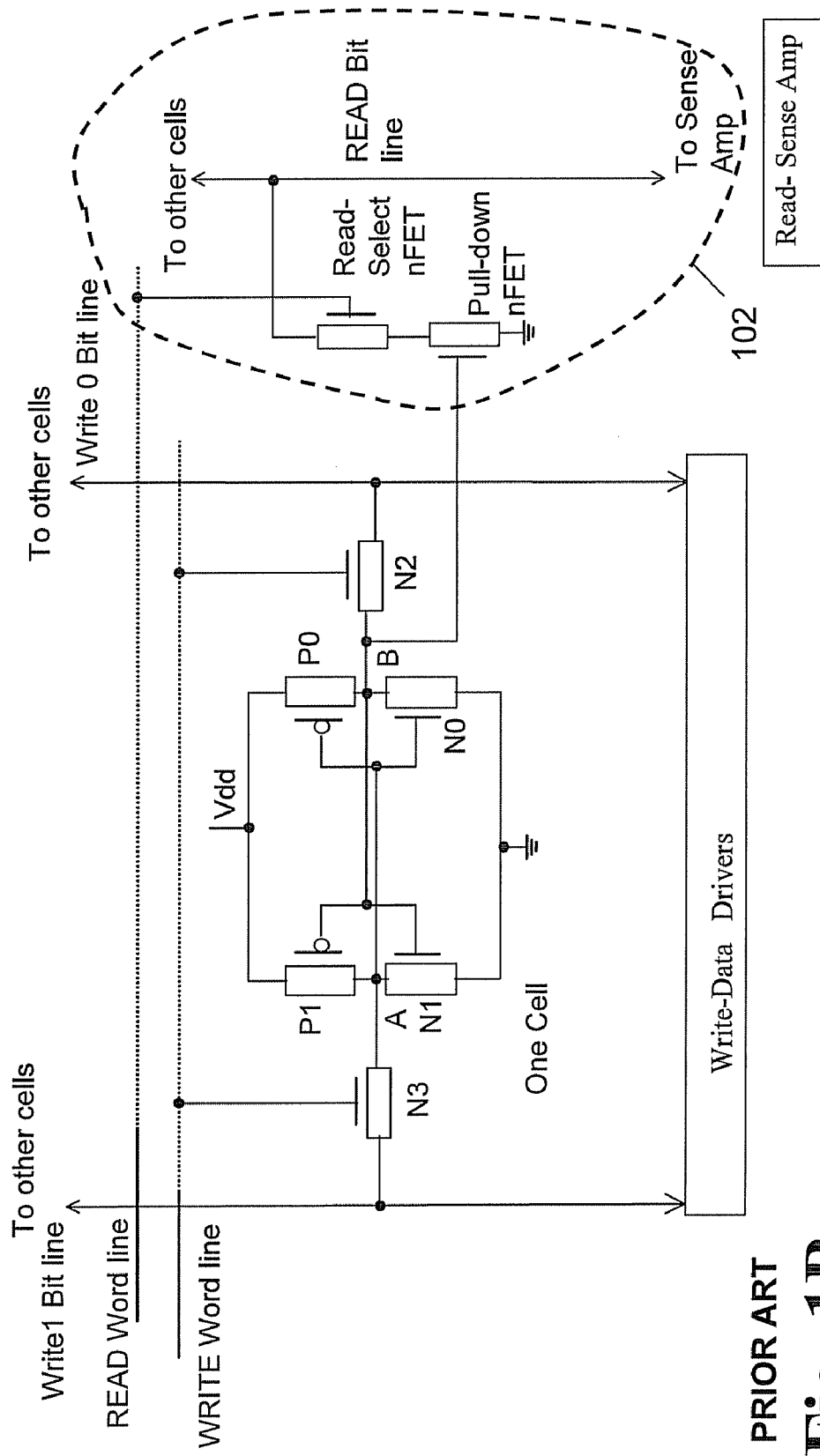
FIG. 1B illustrates one example of a prior art eight device (8T) SRAM cell which uses two additional devices for the reading of the cross-coupled six device SRAM cell.
Figure 1C:
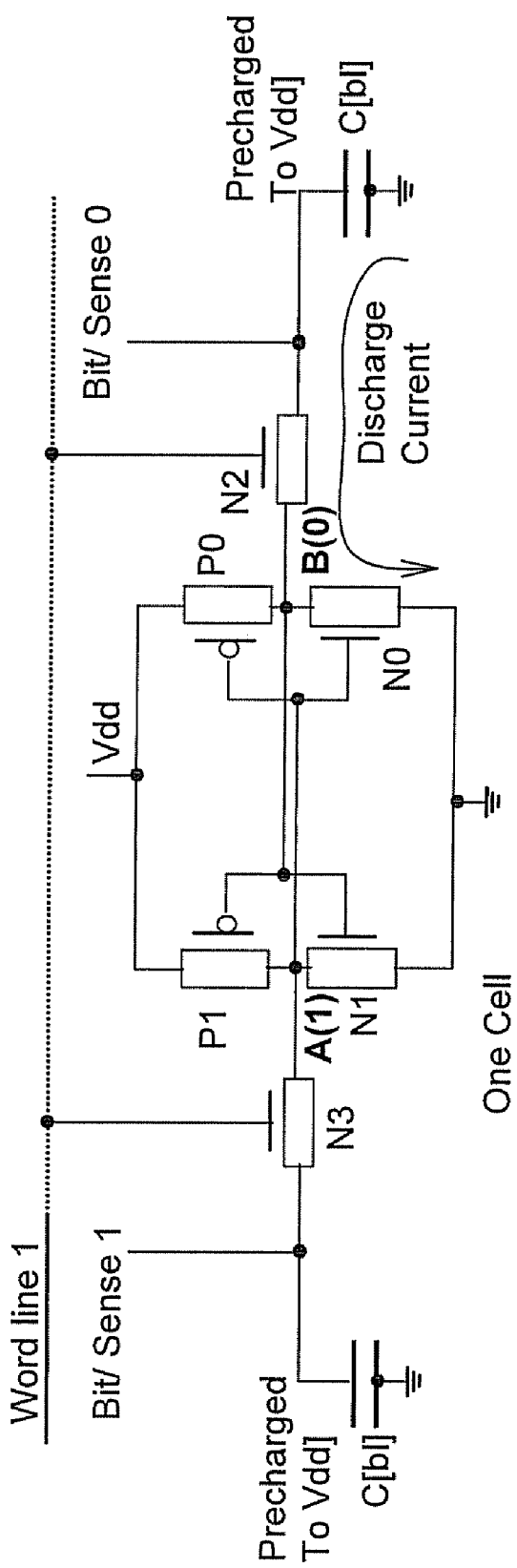
FIG. 1C illustrates one example of a prior art read 'disturb' voltage on node 'B' of 6T cell due to the discharging of a very large, precharged bit line capacitance through device N0.

One of the issues that can give rise to the read 'disturb' can best be understood in terms of the capacitance loading connected to an SRAM cell during reading. An equivalent circuit for the reading of the cross-coupled six device SRAM cell, is illustrated in prior art FIG. 1C. It is assumed that the storage node 'B' is at '0' volts initially (node 'A' necessarily at Vdd volts). In the state of the art, balanced sensing, a pair of (nearly) identical capacitors, C(BL) (capacitance of the bit lines) are precharged to Vdd and then suddenly connected to nodes 'A' and 'B'. Node 'A', being already at Vdd, is not affected. However, node 'B', initially at '0', now has a large capacitor, C(BL) the bit line capacitance at voltage Vdd connected to it. The FET pull-down device, N0, must sink the charge on C(BL) to ground in order to discharge it to some low value. However, device N0, even in the 'ON' state has a significant resistance, so the voltage from node 'B' to ground will increase above '0'. In the meantime, device N1 has its gate voltage supposedly at '0' (at voltage of node 'B') so it is 'OFF', and P1 is 'ON', which allows node 'A' to remain 'HIGH'. However, if the threshold voltage, Vt, of device N1 just happens to be sufficiently lower than that of device N0, and if node 'B' happens to rise sufficiently 'HIGH', device N1 will start to turn 'ON'. The feedback effect of the cross-coupled arrangement will reinforce this and can cause the node voltages at 'A' and 'B' to reverse states, an error.

The culprit in this scenario is the very large bit line capacitance which makes it difficult to hold node 'B' at '0', plus the large tolerance variation between devices N0 and N1 (note, tolerance variations on P1 and P0 contribute in a somewhat analogous manner).

Since the tolerance variations on the FET devices are fixed by the technology, these cannot be changed, except by making the devices and thus cell larger than minimum size. The tolerance difference between adjacent devices varies as k/(SqRt(Width*Length)) where 'k' is a technology constant. Thus, if the length and/or width are made larger, the tolerance variation is reduced, but the density decreases significantly, if this is to be avoided, then the alternative solution is to control the capacitance load connected to the internal nodes, for reading the cell state. This is exactly what differentiates the 7T/H from the 8T cell. In the 8T cell (prior art FIG. 1B) the large bit line capacitance C(BL) of the 6T cell is replaced by a very small capacitor, namely the gate capacitance of the pull-down FET which is directly connected to node 'B'. Also, this gate capacitance is not precharged into any state, but rather takes on the voltage of node 'B' during writing of the cell. There are some other capacitance components, and displacement currents when the read-select device is turned 'ON' for reading that cell, but these are small. Thus we expect this arrangement to have a minimum 'disturb' effect on the cell. However, it requires two additional devices per cell, giving a significant reduction in density.

Compared to the 6T cell, the 7T/H cell of this invention significantly reduces the capacitance load, C(BL) placed on the cell during reading by the use of a hierarchical bit line. Thus the 7T/H cell will tolerate larger 'disturb' conditions than the 6T cell, for equivalent number of cells per bit line. The 7T/H cell will be slightly less stable than the 8T cell. Nevertheless there is a very wide range of stable cell operation for the 7T/H cell and it gives significantly faster read-access time and smaller cell size than the 8T cell.

The writing of the 7T/H cell is identical to that of the 6T or 8T cell. The writing speed will be comparable or slightly faster than the 8T cell due to the density improvement, (shorter word line and/or bit line, depending on layout).

Figure 4:
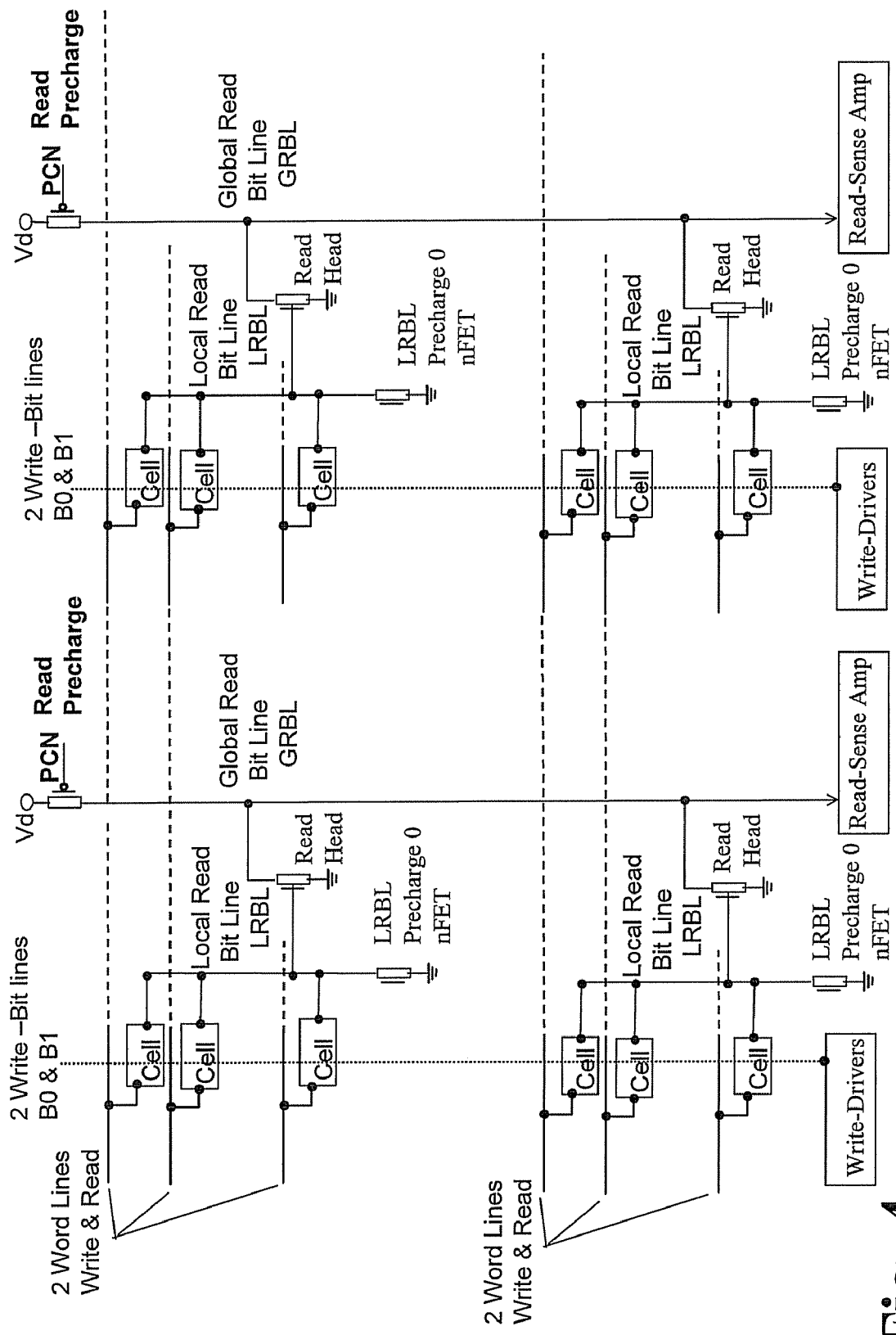
FIG. 4 illustrates one example of a multiple local read bit lines LRBLs connected to multiple global read bit line, GRBL with column read-sense amp at end of the GRBL.

Multiple cells connected to one global read bit line referred to as a column are connected by means of a hierarchy of local read bit lines, LRBLs, and read-heads, RH, as indicated in FIG. 3. Multiple cells are connected to any one LRBL, through multiple read-pass nFETs, one for each cell as shown. Multiple such LRBLs are connected to a GRBL via a read-head, one read-head per LRBL. The number of LRBLs with read-head, per GRBL is a design parameter. A typical number might be 16, with a range from 1 to 64 or more. This column arrangement gives one bit per word line. To achieve multiple bits per word line, identical columns are added to the word lines as one example is illustrated in FIG. 4.

It can be seen that for both the 8T and 7T cells, an additional word line is required. Furthermore, for the 8T cell, one additional bit line is required and the 7T cell requires two additional bit lines, namely the LRBL (short segments) and GRBL. However, these two bits lines run parallel to each other and can be placed on separate metal wiring levels, requiring only one wiring pitch per cell, similar to the 8T cell.

For reading, the 7T/H cell makes use of a hierarchical bit line structure to achieve speed and density. A global read bit line, GRBL, is initially precharged high (e.g. to Vdd) and subsequently is either pulled to '0' or remains 'HIGH' for sensing the two binary states of the cell. Whether the GRBL is pulled to '0' for a stored '1' or stored '0' is purely arbitrary, depending on the definition of internal cell nodes, 'A' and 'B' illustrated in FIG. 2, for '1' and '0', as well as which of these two node is used for reading, as will be seen.

In an exemplary embodiment for example and not a limitation, the fundamental idea for reading is that one of the cell nodes, 'A' or 'B', (assume node 'B' in the following) is initially connected to a very lightly loaded (small capacitance) local read bit line, LRBL, through a read select pass gate as illustrated in FIG. 2. This pass device transfers the voltage at node 'B' to the gate of a read-head, RH, which is connected to the global read bit line as illustrated. GRBL has previously been precharged 'HIGH', to Vdd. If node 'B' is at Vdd (node 'A' thus is at '0'), the read-head device will be turned 'ON' and will discharge GRBL to '0'. If node 'B' is at '0' (node 'A' high), then the RH device is 'OFF' and the GRBL remains 'HIGH'.

Before reading commences the local read bit line, LRBL, is discharged and held at ground. At the beginning of the read cycle, the LRBL is released from ground (floating) by turning 'OFF' the nFET LRBL precharge '0'. This is necessary since an array of cells will have multiple LRBL and multiple read-heads connected to one global read bit line, and all these other LRBL must be deactivated (at '0') so their respective read-heads are 'OFF', except the one chosen to be read. By so doing, the selected LRBL can take on the voltage state of node 'B' of the selected cell when the read-pass device is turned 'ON' by a +voltage signal on a separate word line used for reading, namely word-line-read, WLR.

Simulations have shown that for typical cell device sizes, and lengths of bit lines crossing 256 word lines per column (row any value) the 7T/H sensing structure gives a read time from word line 'HIGH' (50% pt) to GRBL 'LOW' (50% Pt) which is more than twice as fast as the 8T structure. Presently, SRAM arrays for high speed L2 cache applications are using very short bit lines, i.e. column covering only 8 to 16 bits, in order to limit the 'C' loading, thus giving higher speed and better stability. However, this requires significantly more peripheral devices (sense amps, drivers, selectors etc), which can be avoided by the use of the 7T/H cell.

On example of simulations of the 7T/H and 8Tcells for various configurations and conditions are illustrated in FIGS. 6 and 7. Referring to FIGS. 6 and 7 there is illustrated one example of tables that present the nominal read access delay for the 7T/H and 8T cell respectively and show very significant speed improvement of the 7T/H over the 8T cell, as follows for three different column heights covering 64, 128 and 256 word lines (64, 128, 256 cells per bit line) the array delay (50% points) from word line rising to bit line falling for the 7T/H vs. 8T cell using a nominal design with near minimum devices three cases of which are summarized as follows:

Case 1:
64 bits per global bit line
Delay 7T/H=68 ps
Delay 8T=122 ps
Case 2:
128 bits per global bit line
Delay 7T/H=96 ps
Delay 8T=234 ps
Case 3:
256 bits per global bit line
Delay 7T/H=168 ps
Delay 8T=444 ps In each case, the 7T/H cell is a factor of almost 2 to 2.6 times faster than the 8T cell. The complete set of devices and conditions for these simulations are illustrated in FIG. 6, and 7. It can be seen that increasing the sizes of some selected devices can improve the speed of these cells, but this compromises density. Thus various density speed tradeoffs are possible.

One of the fundamental design issues can be when a read cycle commences and the capacitance load of the selected LRBL and associated devices is 'dumped' on node 'B' of the SRAM cell (FIG. 2). The current drawn out of node 'B' to charge this LRBL is proportional to 'C' dV/dt where 'C' is the total capacitance connected to node 'B' by the read-pass device, and 'V' is the voltage across the LRBL capacitance. The faster this occurs (i.e. shorter time constant on the RC read circuit), the more current drawn from node 'B', and the larger the 'disturb' on node 'B'. The cell may or may not be able to supply this charging current in a stable manner, depending on the actual, and relative sizes of the various devices. For increased speed, a fast charging time (small time constant) is desired which reduces the 'disturb' margins on the SRAM cell Vt tolerances (i.e. more sensitive to 'disturbs'). The read stability can be improved by making the time constant larger—one way to do this is by decreasing the width of the read-pass device. This will make the cell smaller, which is desirable, but slower, usually not desirable, but depends on the application.

In a similar manner, the cell stability for reading can be adjusted by changing (very slightly) the widths of devices in the cell itself. For instance, if the number of cells connected to one LRBL is increased, the 'C' load on node 'B' increases and may cause instability. This can be improved by a slight increase in the width of the cell P0 device as illustrated in FIG. 2. The tradeoffs are very dependent on exact array and cell parameters, but many such tradeoffs are possible and give this cell a wide design range of density/speed.

The 7T/H cell and array is quite stable over a wide range of Vt variations. For the devices sizes used in the cell, a typical maximum spread in Vt (in current technologies) for near-adjacent devices is a delta of about 50 mV. Assuming this is divided as plus and minus 25 mV for adjacent n devices and likewise for adjacent p devices, and picking the worst case arrangement of the Vt variations in the cross-coupled flip-flop, the stability for the 7T/H cell in various configurations (number of cells on Local Bit Line, LBL, and number of LBL on a global read bit line, GRBL) one example of which is illustrated in FIGS. 8A-8B (Vt-Tolerances). It can be seen that the cell, in a minimum configuration, is stable for up to 4 times (+ and −100 mV) the allowed Vt spread on the cell devices. The cell is also very tolerant of Vt variations in the read-head, an important issue.

The 7T/H cell may possibly even offer advantages over the 6T cell. As the device tolerances become more severe, the 6T cell must use device sizes, which are larger than, normal scaling would allow. In such cases, the 7T/H cell can use smaller devices, and even though an additional device is required per cell, the total area, even including the additional read and write lines, may give a better density. The design point where this would happen is highly technology dependent, but could possibly be significant.

There are many tradeoffs, which can be made for speed vs. cell size which give this 7T/H cell considerable flexibility and potential application.

Figure 5:
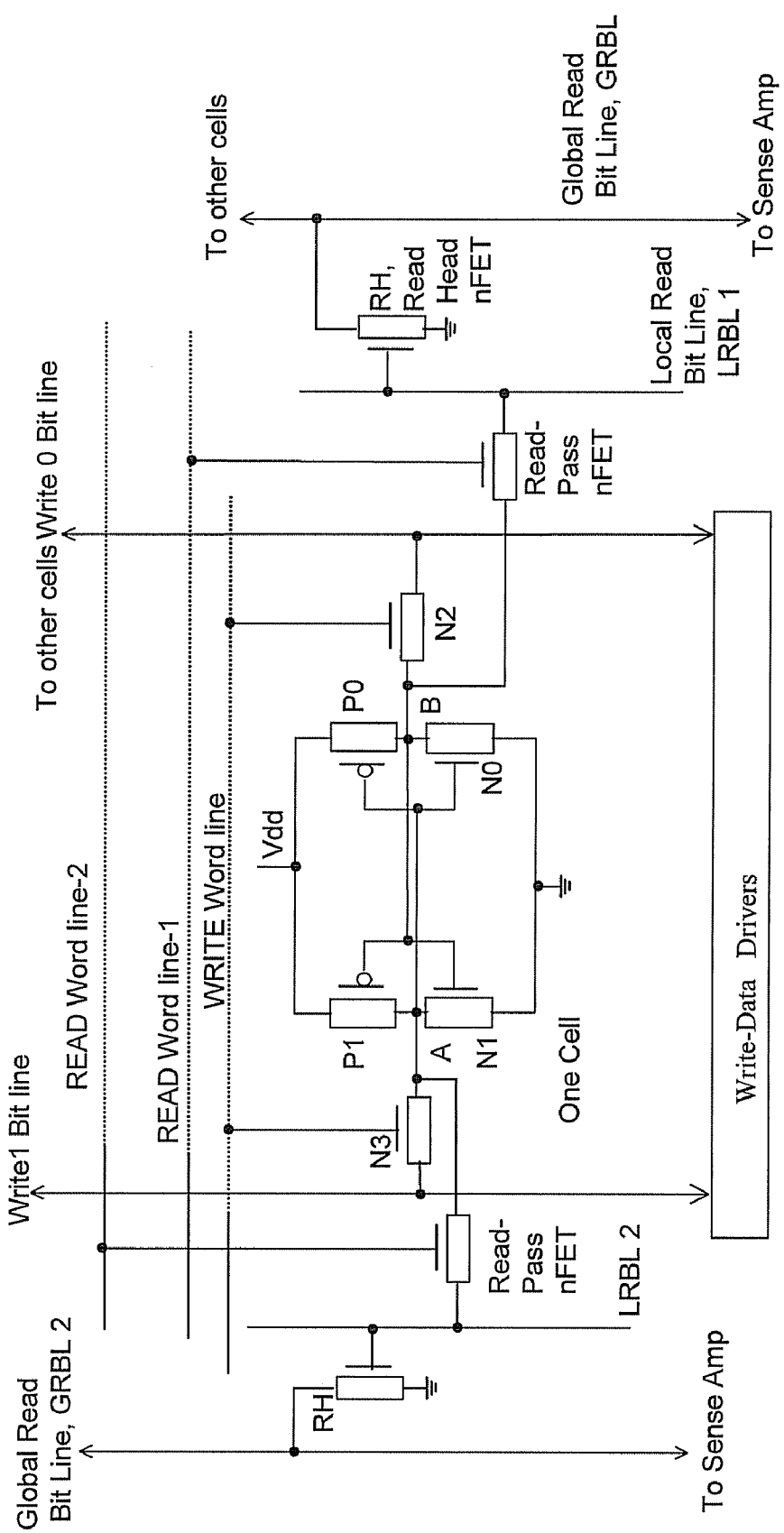
FIG. 5 illustrates one example of a modified, symmetrical 7T/H SRAM cell, providing three separate ports, one separate port for writing and two separate ports for two simultaneous reads of different cells. All three ports can reference same or different cells simultaneously.

By making the 7T/H SRAM cell symmetrical, one example of which is illustrated in FIG. 5, several additional and important features are achieved. If the additional global read bit line, GRBL2 and read word line2 are keep separate from GRBL1 and read word line1, then the cell becomes a true 3-port cell capable of simultaneously writing to one cell while reading data from two other cells. These simultaneous three accesses can be directed all to the same cell, to two cells or three cells with no interference.

Alternatively, if the read word line 2 is electrically tied to read word line 1, then only one cell can be read on one cycle (another can be simultaneously written, of course). But now the bit read lines, GRBL1 and GRBL2 act as a balance sense pair which gives a signal transition and hence clock for reading both a stored '1' and '0', unlike the previous, single ended sensing. This has some advantages in overall clocking and timing of full arrays.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An SRAM memory array comprising:
   a plurality of memory cells, each of said plurality of memory cells further comprising:
   a device, each of said plurality of memory cells having seven of said device;
   a first storage node;
   a second storage node; and
   a first local bit line;
   said first storage node and said second storage node store true and complement of data and are constructed with six of said device forming a cross-coupled flip-flop cell, one of said device being configured as a first read-pass device, said second storage node is connected to said first read-pass device, said first read-pass device passes the state of said second storage node to said first local bit line effectuating single ended sensing, said first read-pass device gate is connected to a first read word line, wherein said device is a transistor, nFET, or pFET;
   a first global bit line, one of said device configured as a first read-head nFET for selectively discharging to ground a previously precharged said first global bit line effectuating passing by way of said first read-head nFET the inverse of a first signal on said first local bit line to said first global bit line, said first local bit line is connected to 1 or more other said plurality of memory cells, said first global bit line passing said first signal to a first sense amplifier.

2. The SRAM memory array in accordance with claim 1, said SRAM memory array further comprising:
   a second local bit line, one of said device being configured as a second read-pass device, said first storage node is connected to said second read-pass device, said second read-pass device passes the state of said first storage node to said second local bit line effectuating single ended sensing, said second read-pass device gate is connected to a second read word line.

3. The SRAM memory array in accordance with claim 2, said SRAM memory array further comprising:
a second global bit line, one of said device configured as a second read-head nFET for selectively discharging to ground a previously precharged said second global bit line effectuating passing by way of said second read-head nFET the inverse of a second signal on said second local bit line to said second global bit line, said second local bit line is connected to at most thirty-two other said plurality of memory cells, said second global bit line passing said second signal to a second sense amplifier.

4. The SRAM memory array in accordance with claim 3, wherein said SRAM memory array is configured as a three port array where two separate reads and one separate write, on the same said plurality of memory cells or on different said plurality of memory cells, can be performed in a single cycle.

* * * * *